(12) United States Patent  (10) Patent No.: US 8,694,853 B1
Sommer  (45) Date of Patent: Apr. 8, 2014

(54) READ COMMANDS FOR READING INTERFERING MEMORY CELLS

(75) Inventor: Naftali Sommer, Rishon Lezion (IL)

(73) Assignee: Apple Inc., Cupertino, CA (US)

( * ) Notice: Subject to any disclaimer, the term of this patent is extended or adjusted under 35 U.S.C. 154(b) by 292 days.

(21) Appl. No.: 13/088,361

(22) Filed: Apr. 17, 2011

Related U.S. Application Data

(60) Provisional application No. 61/330,970, filed on May 4, 2010, provisional application No. 61/390,193, filed on Oct. 6, 2010.

(51) Int. Cl.
*G11C 29/00* (2006.01)

(52) U.S. Cl.
USPC ........................................................ 714/763

(58) Field of Classification Search
USPC ........................................................ 714/763
See application file for complete search history.

(56) References Cited

U.S. PATENT DOCUMENTS

| | | |
|---|---|---|
| 3,668,631 A | 6/1972 | Griffith et al. |
| 3,668,632 A | 6/1972 | Oldham |
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |

(Continued)

FOREIGN PATENT DOCUMENTS

| | | |
|---|---|---|
| EP | 0783754 B1 | 7/1997 |
| EP | 1434236 B1 | 6/2004 |

(Continued)

OTHER PUBLICATIONS

Ankolekar et al., "Multibit Error-Correction Methods for Latency-Constrained Flash Memory Systems", IEEE Transactions on Device and Materials Reliability, vol. 10, No. 1, pp. 33-39, Mar. 2010.

(Continued)

*Primary Examiner* — Albert Decady
*Assistant Examiner* — Enam Ahmed
(74) *Attorney, Agent, or Firm* — Meyertons, Hood, Kivlin, Kowert & Goetzel, P.C.

(57) ABSTRACT

A method for data storage includes, in a memory system that stores data by programming analog memory cells to respective programming states selected from a predefined set, providing a first read command that retrieves the data stored in target memory cells, and a second read command that identifies at least one potentially-interfering memory cell that is programmed to a programming state in a predefined subset of programming states expected to cause interference. Given data is stored in a first group of the memory cells. After storing the given data, the given data is retrieved by reading the first group using the first read command, reading a second group of the memory cells using the second read command, and compensating for the interference caused to the first group by the memory cells in the second group that were identified by the second read command.

16 Claims, 4 Drawing Sheets

(56) References Cited

U.S. PATENT DOCUMENTS

| | | | |
|---|---|---|---|
| 5,056,089 A | 10/1991 | Furuta et al. | |
| 5,077,722 A | 12/1991 | Geist et al. | |
| 5,126,808 A | 6/1992 | Montalvo et al. | |
| 5,163,021 A | 11/1992 | Mehrotra et al. | |
| 5,172,338 A | 12/1992 | Mehrotta et al. | |
| 5,182,558 A | 1/1993 | Mayo | |
| 5,182,752 A | 1/1993 | DeRoo et al. | |
| 5,191,584 A | 3/1993 | Anderson | |
| 5,200,959 A | 4/1993 | Gross et al. | |
| 5,237,535 A | 8/1993 | Mielke et al. | |
| 5,272,669 A | 12/1993 | Samachisa et al. | |
| 5,276,649 A | 1/1994 | Hoshita et al. | |
| 5,287,469 A | 2/1994 | Tsuboi | |
| 5,365,484 A | 11/1994 | Cleveland et al. | |
| 5,388,064 A | 2/1995 | Khan | |
| 5,416,646 A | 5/1995 | Shirai | |
| 5,416,782 A | 5/1995 | Wells et al. | |
| 5,446,854 A | 8/1995 | Khalidi et al. | |
| 5,450,424 A | 9/1995 | Okugaki et al. | |
| 5,469,444 A | 11/1995 | Endoh et al. | |
| 5,473,753 A | 12/1995 | Wells et al. | |
| 5,479,170 A | 12/1995 | Cauwenberghs et al. | |
| 5,508,958 A | 4/1996 | Fazio et al. | |
| 5,519,831 A | 5/1996 | Holzhammer | |
| 5,532,962 A | 7/1996 | Auclair et al. | |
| 5,533,190 A | 7/1996 | Binford et al. | |
| 5,541,886 A | 7/1996 | Hasbun | |
| 5,600,677 A | 2/1997 | Citta et al. | |
| 5,638,320 A | 6/1997 | Wong et al. | |
| 5,657,332 A | 8/1997 | Auclair et al. | |
| 5,675,540 A | 10/1997 | Roohparvar | |
| 5,682,352 A | 10/1997 | Wong et al. | |
| 5,687,114 A | 11/1997 | Khan | |
| 5,696,717 A | 12/1997 | Koh | |
| 5,726,649 A | 3/1998 | Tamaru et al. | |
| 5,726,934 A | 3/1998 | Tran et al. | |
| 5,742,752 A | 4/1998 | De Koening | |
| 5,748,533 A | 5/1998 | Dunlap et al. | |
| 5,748,534 A | 5/1998 | Dunlap et al. | |
| 5,751,637 A | 5/1998 | Chen et al. | |
| 5,761,402 A | 6/1998 | Kaneda et al. | |
| 5,787,484 A * | 7/1998 | Norman | 711/159 |
| 5,798,966 A | 8/1998 | Keeney | |
| 5,799,200 A | 8/1998 | Brant et al. | |
| 5,801,985 A | 9/1998 | Roohparvar et al. | |
| 5,838,832 A | 11/1998 | Barnsley | |
| 5,860,106 A | 1/1999 | Domen et al. | |
| 5,867,114 A | 2/1999 | Barbir | |
| 5,867,428 A | 2/1999 | Ishii et al. | |
| 5,867,429 A | 2/1999 | Chen et al. | |
| 5,877,986 A | 3/1999 | Harari et al. | |
| 5,889,937 A | 3/1999 | Tamagawa | |
| 5,901,089 A | 5/1999 | Korsh et al. | |
| 5,909,449 A | 6/1999 | So et al. | |
| 5,912,906 A | 6/1999 | Wu et al. | |
| 5,930,167 A | 7/1999 | Lee et al. | |
| 5,937,424 A | 8/1999 | Leak et al. | |
| 5,942,004 A | 8/1999 | Cappelletti | |
| 5,946,716 A | 8/1999 | Karp et al. | |
| 5,969,986 A | 10/1999 | Wong et al. | |
| 5,982,668 A | 11/1999 | Ishii et al. | |
| 5,991,517 A | 11/1999 | Harari et al. | |
| 5,995,417 A | 11/1999 | Chen et al. | |
| 6,009,014 A | 12/1999 | Hollmer et al. | |
| 6,009,016 A | 12/1999 | Ishii et al. | |
| 6,023,425 A | 2/2000 | Ishii et al. | |
| 6,024,486 A * | 2/2000 | Olarig et al. | 714/763 |
| 6,034,891 A | 3/2000 | Norman | |
| 6,040,993 A | 3/2000 | Chen et al. | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,141,261 A | 10/2000 | Patti | |
| 6,151,246 A | 11/2000 | So et al. | |
| 6,157,573 A | 12/2000 | Ishii et al. | |
| 6,166,962 A | 12/2000 | Chen et al. | |
| 6,169,691 B1 | 1/2001 | Pasotti et al. | |
| 6,178,466 B1 | 1/2001 | Gilbertson et al. | |
| 6,185,134 B1 | 2/2001 | Tanaka | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee et al. | |
| 6,222,762 B1 | 4/2001 | Guterman et al. | |
| 6,230,233 B1 | 5/2001 | Lofgren et al. | |
| 6,240,458 B1 | 5/2001 | Gilbertson | |
| 6,259,627 B1 | 7/2001 | Wong | |
| 6,275,419 B1 | 8/2001 | Guterman et al. | |
| 6,278,632 B1 | 8/2001 | Chevallier | |
| 6,279,069 B1 | 8/2001 | Robinson et al. | |
| 6,288,944 B1 | 9/2001 | Kawamura | |
| 6,292,394 B1 | 9/2001 | Cohen et al. | |
| 6,301,151 B1 | 10/2001 | Engh et al. | |
| 6,304,486 B1 | 10/2001 | Yano | |
| 6,307,776 B1 | 10/2001 | So et al. | |
| 6,314,044 B1 | 11/2001 | Sasaki et al. | |
| 6,317,363 B1 | 11/2001 | Guterman et al. | |
| 6,317,364 B1 | 11/2001 | Guterman et al. | |
| 6,345,004 B1 | 2/2002 | Omura et al. | |
| 6,360,346 B1 | 3/2002 | Miyauchi et al. | |
| 6,363,008 B1 | 3/2002 | Wong | |
| 6,363,454 B1 | 3/2002 | Lakhani et al. | |
| 6,366,496 B1 | 4/2002 | Torelli et al. | |
| 6,385,092 B1 | 5/2002 | Ishii et al. | |
| 6,392,932 B1 | 5/2002 | Ishii et al. | |
| 6,396,742 B1 | 5/2002 | Korsh et al. | |
| 6,397,364 B1 | 5/2002 | Barkan | |
| 6,405,323 B1 | 6/2002 | Lin et al. | |
| 6,405,342 B1 | 6/2002 | Lee | |
| 6,418,060 B1 | 7/2002 | Yang et al. | |
| 6,442,585 B1 | 8/2002 | Dean et al. | |
| 6,445,602 B1 | 9/2002 | Kokudo et al. | |
| 6,452,838 B1 | 9/2002 | Ishii et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,480,948 B1 | 11/2002 | Virajpet et al. | |
| 6,490,236 B1 | 12/2002 | Fukuda et al. | |
| 6,522,580 B2 | 2/2003 | Chen et al. | |
| 6,525,952 B2 | 2/2003 | Araki et al. | |
| 6,532,556 B1 | 3/2003 | Wong et al. | |
| 6,538,922 B1 | 3/2003 | Khalid et al. | |
| 6,549,464 B2 | 4/2003 | Tanaka et al. | |
| 6,553,510 B1 | 4/2003 | Pekny et al. | |
| 6,558,967 B1 | 5/2003 | Wong | |
| 6,560,152 B1 | 5/2003 | Cernea | |
| 6,567,311 B2 | 5/2003 | Ishii et al. | |
| 6,577,539 B2 | 6/2003 | Iwahashi | |
| 6,584,012 B2 | 6/2003 | Banks | |
| 6,615,307 B1 | 9/2003 | Roohparvar | |
| 6,621,739 B2 | 9/2003 | Gonzalez et al. | |
| 6,640,326 B1 | 10/2003 | Buckingham et al. | |
| 6,643,169 B2 | 11/2003 | Rudelic et al. | |
| 6,646,913 B2 | 11/2003 | Micheloni et al. | |
| 6,678,192 B2 | 1/2004 | Gongwer et al. | |
| 6,683,811 B2 | 1/2004 | Ishii et al. | |
| 6,687,155 B2 | 2/2004 | Nagasue | |
| 6,707,748 B2 | 3/2004 | Lin et al. | |
| 6,708,257 B2 | 3/2004 | Bao | |
| 6,714,449 B2 | 3/2004 | Khalid | |
| 6,717,847 B2 | 4/2004 | Chen | |
| 6,731,557 B2 | 5/2004 | Beretta | |
| 6,732,250 B2 | 5/2004 | Durrant | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,774,808 B1 | 8/2004 | Hibbs et al. | |
| 6,781,877 B2 | 8/2004 | Cernea et al. | |
| 6,804,805 B2 | 10/2004 | Rub | |

(56) References Cited

U.S. PATENT DOCUMENTS

| | | | |
|---|---|---|---|
| 6,807,095 | B2 | 10/2004 | Chen et al. |
| 6,807,101 | B2 | 10/2004 | Ooishi et al. |
| 6,809,964 | B2 | 10/2004 | Moschopoulos et al. |
| 6,819,592 | B2 | 11/2004 | Noguchi et al. |
| 6,829,167 | B2 | 12/2004 | Tu et al. |
| 6,845,052 | B1 | 1/2005 | Ho et al. |
| 6,851,018 | B2 | 2/2005 | Wyatt et al. |
| 6,851,081 | B2 | 2/2005 | Yamamoto |
| 6,856,546 | B2 | 2/2005 | Guterman et al. |
| 6,862,218 | B2 | 3/2005 | Guterman et al. |
| 6,870,767 | B2 | 3/2005 | Rudelic et al. |
| 6,870,773 | B2 | 3/2005 | Noguchi et al. |
| 6,873,552 | B2 | 3/2005 | Ishii et al. |
| 6,879,520 | B2 | 4/2005 | Hosono et al. |
| 6,882,567 | B1 | 4/2005 | Wong |
| 6,894,926 | B2 | 5/2005 | Guterman et al. |
| 6,907,497 | B2 | 6/2005 | Hosono et al. |
| 6,925,009 | B2 | 8/2005 | Noguchi et al. |
| 6,930,925 | B2 | 8/2005 | Guo et al. |
| 6,934,188 | B2 | 8/2005 | Roohparvar |
| 6,937,511 | B2 | 8/2005 | Hsu et al. |
| 6,958,938 | B2 | 10/2005 | Noguchi et al. |
| 6,963,505 | B2 | 11/2005 | Cohen |
| 6,972,993 | B2 | 12/2005 | Conley et al. |
| 6,988,175 | B2 | 1/2006 | Lasser |
| 6,992,932 | B2 | 1/2006 | Cohen |
| 6,999,344 | B2 | 2/2006 | Hosono et al. |
| 7,002,843 | B2 | 2/2006 | Guterman et al. |
| 7,006,379 | B2 | 2/2006 | Noguchi et al. |
| 7,012,835 | B2 | 3/2006 | Gonzalez et al. |
| 7,020,017 | B2 | 3/2006 | Chen et al. |
| 7,023,735 | B2 | 4/2006 | Ban et al. |
| 7,031,210 | B2 | 4/2006 | Park et al. |
| 7,031,214 | B2 | 4/2006 | Tran |
| 7,031,216 | B2 | 4/2006 | You |
| 7,039,846 | B2 | 5/2006 | Hewitt et al. |
| 7,042,766 | B1 | 5/2006 | Wang et al. |
| 7,054,193 | B1 | 5/2006 | Wong |
| 7,054,199 | B2 | 5/2006 | Lee et al. |
| 7,057,958 | B2 | 6/2006 | So et al. |
| 7,065,147 | B2 | 6/2006 | Ophir et al. |
| 7,068,539 | B2 | 6/2006 | Guterman et al. |
| 7,071,849 | B2 | 7/2006 | Zhang |
| 7,072,222 | B2 | 7/2006 | Ishii et al. |
| 7,079,555 | B2 | 7/2006 | Baydar et al. |
| 7,088,615 | B2 | 8/2006 | Guterman et al. |
| 7,099,194 | B2 | 8/2006 | Tu et al. |
| 7,102,924 | B2 | 9/2006 | Chen et al. |
| 7,113,432 | B2 | 9/2006 | Mokhlesi |
| 7,130,210 | B2 | 10/2006 | Bathul et al. |
| 7,139,192 | B1 | 11/2006 | Wong |
| 7,139,198 | B2 | 11/2006 | Guterman et al. |
| 7,145,805 | B2 | 12/2006 | Ishii et al. |
| 7,151,692 | B2 | 12/2006 | Wu |
| 7,158,058 | B1 | 1/2007 | Yu |
| 7,170,781 | B2 | 1/2007 | So et al. |
| 7,170,802 | B2 | 1/2007 | Cernea et al. |
| 7,173,859 | B2 | 2/2007 | Hemink |
| 7,177,184 | B2 | 2/2007 | Chen |
| 7,177,195 | B2 | 2/2007 | Gonzalez et al. |
| 7,177,199 | B2 | 2/2007 | Chen et al. |
| 7,177,200 | B2 | 2/2007 | Ronen et al. |
| 7,184,338 | B2 | 2/2007 | Nagakawa et al. |
| 7,187,195 | B2 | 3/2007 | Kim |
| 7,187,592 | B2 | 3/2007 | Guterman et al. |
| 7,190,614 | B2 | 3/2007 | Wu |
| 7,193,898 | B2 | 3/2007 | Cernea |
| 7,193,921 | B2 | 3/2007 | Choi et al. |
| 7,196,644 | B1 | 3/2007 | Anderson et al. |
| 7,196,928 | B2 | 3/2007 | Chen |
| 7,196,933 | B2 | 3/2007 | Shibata |
| 7,197,594 | B2 | 3/2007 | Raz et al. |
| 7,200,062 | B2 | 4/2007 | Kinsely et al. |
| 7,210,077 | B2 | 4/2007 | Brandenberger et al. |
| 7,221,592 | B2 | 5/2007 | Nazarian |
| 7,224,613 | B2 | 5/2007 | Chen et al. |
| 7,231,474 | B1 | 6/2007 | Helms et al. |
| 7,231,562 | B2 | 6/2007 | Ohlhoff et al. |
| 7,243,275 | B2 | 7/2007 | Gongwer et al. |
| 7,254,690 | B2 | 8/2007 | Rao |
| 7,254,763 | B2 | 8/2007 | Aadsen et al. |
| 7,257,027 | B2 | 8/2007 | Park |
| 7,259,987 | B2 | 8/2007 | Chen et al. |
| 7,266,026 | B2 | 9/2007 | Gongwer et al. |
| 7,266,069 | B2 | 9/2007 | Chu |
| 7,269,066 | B2 | 9/2007 | Nguyen et al. |
| 7,272,757 | B2 | 9/2007 | Stocken |
| 7,274,611 | B2 | 9/2007 | Roohparvar |
| 7,277,355 | B2 | 10/2007 | Tanzana |
| 7,280,398 | B1 | 10/2007 | Lee et al. |
| 7,280,409 | B2 | 10/2007 | Misumi et al. |
| 7,280,415 | B2 | 10/2007 | Hwang et al. |
| 7,283,399 | B2 | 10/2007 | Ishii et al. |
| 7,289,344 | B2 | 10/2007 | Chen |
| 7,301,807 | B2 | 11/2007 | Khalid et al. |
| 7,301,817 | B2 | 11/2007 | Li et al. |
| 7,308,525 | B2 | 12/2007 | Lasser et al. |
| 7,310,255 | B2 | 12/2007 | Chan |
| 7,310,269 | B2 | 12/2007 | Shibata |
| 7,310,271 | B2 | 12/2007 | Lee |
| 7,310,272 | B1 | 12/2007 | Mokhlesi et al. |
| 7,310,347 | B2 | 12/2007 | Lasser |
| 7,312,727 | B1 | 12/2007 | Feng et al. |
| 7,321,509 | B2 | 1/2008 | Chen et al. |
| 7,328,384 | B1 | 2/2008 | Kulkarni et al. |
| 7,342,831 | B2 | 3/2008 | Mokhlesi et al. |
| 7,343,330 | B1 | 3/2008 | Boesjes et al. |
| 7,345,924 | B2 | 3/2008 | Nguyen et al. |
| 7,345,928 | B2 | 3/2008 | Li |
| 7,349,263 | B2 | 3/2008 | Kim et al. |
| 7,356,755 | B2 | 4/2008 | Fackenthal |
| 7,363,420 | B2 | 4/2008 | Lin et al. |
| 7,365,671 | B1 | 4/2008 | Anderson |
| 7,388,781 | B2 | 6/2008 | Litsyn et al. |
| 7,397,697 | B2 | 7/2008 | So et al. |
| 7,405,974 | B2 | 7/2008 | Yaoi et al. |
| 7,405,979 | B2 | 7/2008 | Ishii et al. |
| 7,408,804 | B2 | 8/2008 | Hemink et al. |
| 7,408,810 | B2 | 8/2008 | Aritome et al. |
| 7,409,473 | B2 | 8/2008 | Conley et al. |
| 7,409,623 | B2 | 8/2008 | Baker et al. |
| 7,420,847 | B2 | 9/2008 | Li |
| 7,433,231 | B2 | 10/2008 | Aritome |
| 7,433,697 | B2 | 10/2008 | Karaoguz et al. |
| 7,434,111 | B2 | 10/2008 | Sugiura et al. |
| 7,437,498 | B2 | 10/2008 | Ronen |
| 7,440,324 | B2 | 10/2008 | Mokhlesi |
| 7,440,331 | B2 | 10/2008 | Hemink |
| 7,441,067 | B2 | 10/2008 | Gorobets et al. |
| 7,447,970 | B2 | 11/2008 | Wu et al. |
| 7,450,421 | B2 | 11/2008 | Mokhlesi et al. |
| 7,453,737 | B2 | 11/2008 | Ha |
| 7,457,163 | B2 | 11/2008 | Hemink |
| 7,457,897 | B1 | 11/2008 | Lee et al. |
| 7,460,410 | B2 | 12/2008 | Nagai et al. |
| 7,460,412 | B2 | 12/2008 | Lee et al. |
| 7,466,592 | B2 | 12/2008 | Mitani et al. |
| 7,468,907 | B2 | 12/2008 | Kang et al. |
| 7,468,911 | B2 | 12/2008 | Lutze et al. |
| 7,469,049 | B1 | 12/2008 | Feng |
| 7,471,581 | B2 | 12/2008 | Tran et al. |
| 7,483,319 | B2 | 1/2009 | Brown |
| 7,487,329 | B2 | 2/2009 | Hepkin et al. |
| 7,487,394 | B2 | 2/2009 | Forhan et al. |
| 7,492,641 | B2 | 2/2009 | Hosono et al. |
| 7,508,710 | B2 | 3/2009 | Mokhlesi |
| 7,526,711 | B2 | 4/2009 | Orio |
| 7,539,061 | B2 | 5/2009 | Lee |
| 7,539,062 | B2 | 5/2009 | Doyle |
| 7,551,492 | B2 | 6/2009 | Kim |
| 7,558,109 | B2 | 7/2009 | Brandman et al. |
| 7,558,839 | B1 | 7/2009 | McGovern |
| 7,568,135 | B2 | 7/2009 | Cornwell et al. |
| 7,570,520 | B2 | 8/2009 | Kamei et al. |

(56) References Cited

U.S. PATENT DOCUMENTS

| | | |
|---|---|---|
| 7,574,555 B2 | 8/2009 | Porat et al. |
| 7,590,002 B2 | 9/2009 | Mokhlesi et al. |
| 7,593,259 B2 | 9/2009 | Kim |
| 7,594,093 B1 | 9/2009 | Kancherla |
| 7,596,707 B1 | 9/2009 | Vemula |
| 7,609,787 B2 | 10/2009 | Jahan et al. |
| 7,613,043 B2 | 11/2009 | Cornwell et al. |
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 | 10/2010 | Radke |
| 7,848,149 B2 | 12/2010 | Gonzalez et al. |
| 7,869,273 B2 | 1/2011 | Lee et al. |
| 7,885,119 B2 | 2/2011 | Li |
| 7,904,783 B2 | 3/2011 | Brandman et al. |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 8,291,271 B2 * | 10/2012 | Roohparvar et al. ......... 714/718 |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |
| 2007/0103978 A1 | 5/2007 | Conley et al. |
| 2007/0104211 A1 | 5/2007 | Opsasnick |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobets |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |

(56) References Cited

U.S. PATENT DOCUMENTS

| | | |
|---|---|---|
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0158983 A1* | 7/2008 | Mokhlesi et al. ........ 365/185.21 |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0240872 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0124088 A1 | 5/2010 | Shalvi et al. |
| 2010/0131697 A1 | 5/2010 | Alrod et al. |
| 2010/0131827 A1 | 5/2010 | Sokolov et al. |
| 2010/0142268 A1 | 6/2010 | Aritome |
| 2010/0142277 A1 | 6/2010 | Yang et al. |
| 2010/0157675 A1 | 6/2010 | Shalvi et al. |
| 2010/0165689 A1 | 7/2010 | Rotbard et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0195390 A1 | 8/2010 | Shalvi |
| 2010/0199150 A1 | 8/2010 | Shalvi et al. |
| 2010/0211803 A1 | 8/2010 | Lablans |
| 2010/0220509 A1 | 9/2010 | Sokolov et al. |
| 2010/0220510 A1 | 9/2010 | Shalvi |
| 2010/0250836 A1 | 9/2010 | Sokolov et al. |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 8/2009 |
| WO | 2009095902 A2 | 8/2009 |
| WO | 2011024015 A1 | 3/2011 |

OTHER PUBLICATIONS

U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
Wei, L., "Trellis-Coded Modulation With Multidimensional Constellations", IEEE Transactions on Information Theory, vol. IT-33, No. 4, pp. 483-501, Jul. 1987.

(56) References Cited

OTHER PUBLICATIONS

U.S. Appl. No. 13/114,049 Official Action dated Sep. 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
SAS Protocol, "Information Technology—Serial Attached SCSI-2 (SAS-2)", INCITS document T10/1760-D, revision 15a, Feb. 22, 2009.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Compaq et al., "Universal Serial Bus Specification", revision 2.0, Apr. 27, 2000.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in FLASH", pp. 115-118, Proceedings of the IEEE 2002 Custom Integrated Circuits Conference, May 12-15, 2002.
Engineering Windows 7, "Support and Q&A for Solid-State Drives", e7blog, May 5, 2009.
Goodman et al., "On-Chip ECC for Multi-Level Random Access Memories," Proceedings of the IEEE/CAM Information Theory Workshop, Ithaca, USA, Jun. 25-29, 1989.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
Horstein, "On the Design of Signals for Sequential and Nonsequential Detection Systems with Feedback," IEEE Transactions on Information Theory IT-12:4 (Oct. 1966), pp. 448-455.
How to Resolve Bad Super Block: Magic Number Wrong"in BSD", Free Online Articles Director Article Base, posted Sep. 5, 2009.
Huffman, A., "Non-Volatile Memory Host Controller Interface (NVMHCI)", Specification 1.0, Apr. 14, 2008.
Jedec Standard JESD84-C44, "Embedded MultiMediaCard (eMMC) Mechanical Standard, with Optional Reset Signal", Jedec Solid State Technology Association, USA, Jul. 2009.
Jedec, "UFS Specification", version 0.1, Nov. 11, 2009.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Kawaguchi et al. 1995. A flash-memory based file system. In Proceedings of the USENIX 1995 Technical Conference, New Orleans, Louisiana. 155-164.
Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.
Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.
Mielke et al., "Recovery Effects in the Distributed Cycling of Flash Memories", IEEE 44th Annual International Reliability Physics Symposium, pp. 29-35, San Jose, USA, Mar. 2006.
Micron Technology Inc., "Memory Management in NAND Flash Arrays", Technical Note, year 2005.
Numonyx, "M25PE16: 16-Mbit, page-erasable serial flash memory with byte-alterability, 75 MHz SPI bus, standard pinout", Apr. 2008.
Onfi, "Open NAND Flash Interface Specification," revision 1.0, Dec. 28, 2006.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
Park et al., "Sub-Grouped Superblock Management for High-Performance Flash Storages", IEICE Electronics Express, vol. 6, No. 6, pp. 297-303, Mar. 25, 2009.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW'2003), Paris, France, Mar. 31-Apr. 4, 2003.
SD Group and SD Card Association, "SD Specifications Part 1 Physical Layer Specification", version 3.01, draft 1.00, Nov. 9, 2009.

(56) References Cited

OTHER PUBLICATIONS

Serial ATA International Organization, "Serial ATA Revision 3.0 Specification", Jun. 2, 2009.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.
ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.
Super User Forums, "SD Card Failure, can't read superblock", posted Aug. 8, 2010.
Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.
Takeuchi et al., "A Multipage Cell Architecture for High-Speed Programming Multilevel NAND Flash Memories", IEEE Journal of Solid State Circuits, vol. 33, No. 8, Aug. 1998.
UBUNTU Forums, "Memory Stick Failed IO Superblock", posted Nov. 11, 2009.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.
International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
U.S. Appl. No. 11/949,135 Official Action dated Oct. 2, 2009.
U.S. Appl. No. 12/019,011 Official Action dated Nov. 20, 2009.
U.S. Appl. No. 11/957,970 Official Action dated May 20, 2010.
U.S. Appl. No. 12/171,797 Official Action dated Aug. 25, 2010.
U.S. Appl. No. 11/945,575 Official Action dated Aug. 24, 2010.
U.S. Appl. No. 12/497,707 Official Action dated Sep. 15, 2010.
U.S. Appl. No. 11/995,801 Official Action dated Oct. 15, 2010.
U.S. Appl. No. 12/045,520 Official Action dated Nov. 16, 2010.
U.S. Appl. No. 12/388,528 Official Action dated Nov. 29, 2010.
U.S. Appl. No. 11/995,814 Official Action dated Dec. 17, 2010.
U.S. Appl. No. 12/251,471 Official Action dated Jan. 3, 2011.
U.S. Appl. No. 12/171,797, filed Jul. 11, 2008.
U.S. Appl. No. 12/251,471, filed Oct. 15, 2008.
U.S. Appl. No. 12/497,707, filed Jul. 6, 2009.
U.S. Appl. No. 12/534,893, filed Aug. 4, 2009.
U.S. Appl. No. 12/534,898, filed Aug. 4, 2009.
U.S. Appl. No. 12/551,583, filed Sep. 1, 2009.
U.S. Appl. No. 12/551,567, filed Sep. 1, 2009.
U.S. Appl. No. 12/558,528, filed Sep. 13, 2009.
U.S. Appl. No. 12/579,430, filed Oct. 15, 2009.
U.S. Appl. No. 12/579,432, filed Oct. 15, 2009.
U.S. Appl. No. 12/607,078, filed Oct. 28, 2009.
U.S. Appl. No. 12/607,085, filed Oct. 28, 2009.
U.S. Appl. No. 12/649,358, filed Dec. 30, 2009.
U.S. Appl. No. 12/649,360, filed Dec. 30, 2009.
U.S. Appl. No. 12/688,883, filed Jan. 17, 2010.
U.S. Appl. No. 12/728,296, filed Mar. 22, 2010.
U.S. Appl. No. 12/758,003, filed Apr. 11, 2010.
U.S. Appl. No. 12/880,101, filed Sep. 12, 2010.
U.S. Appl. No. 12/890,724, filed Sep. 27, 2010.
U.S. Appl. No. 12/822,207, filed Jun. 24, 2010.
U.S. Appl. No. 12/987,174, filed Jan. 10, 2011.
U.S. Appl. No. 12/987,175, filed Jan. 10, 2011.
U.S. Appl. No. 12/963,649, filed Dec. 9, 2010.
U.S. Appl. No. 13/021,754, filed Feb. 6, 2011.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
US 7,161,836, 01/2007, Wan et al. (withdrawn)

* cited by examiner

READ COMMANDS FOR READING INTERFERING MEMORY CELLS

CROSS-REFERENCE TO RELATED APPLICATIONS

This application claims the benefit of U.S. Provisional Patent Application 61/330,970, filed May 4, 2010, and U.S. Provisional Patent Application 61/390,193, filed Oct. 6, 2010, whose disclosures are incorporated herein by reference.

FIELD OF THE INVENTION

The present invention relates generally to memory devices, and particularly to methods and systems for interference estimation and cancellation in analog memory cells.

BACKGROUND OF THE INVENTION

In arrays of analog memory cells, such as in Flash memory devices, memory cells may suffer from interference from other memory cells in the array. This interference may introduce read errors and therefore degrade the storage reliability of the memory. Various techniques for interference estimation and cancellation in analog memory cell arrays are known in the art.

For example, PCT International Publication WO 2007/132457, whose disclosure is incorporated herein by reference, describes a method for operating a memory device. The method includes encoding data using an Error Correction Code (ECC) and storing the encoded data as first analog values in respective analog memory cells of the memory device. After storing the encoded data, second analog values are read from the respective memory cells of the memory device in which the encoded data were stored. At least some of the second analog values differ from the respective first analog values. A distortion that is present in the second analog values is estimated. Error correction metrics are computed with respect to the second analog values responsively to the estimated distortion. The second analog values are processed using the error correction metrics in an ECC decoding process, so as to reconstruct the data.

U.S. Patent application Publication 2009/0240872, whose disclosure is incorporated herein by reference, describes a method for data storage that includes defining at least first and second read commands for reading storage values from analog memory cells. The first read command reads the storage values at a first accuracy, and the second read command reads the storage values at a second accuracy, which is finer than the first accuracy. In some embodiments, interference cancellation is applied to a certain group of memory cells by reading the storage values of the potentially-interfering cells using a faster but lower-accuracy read command.

As another example, U.S. Patent application Publication 2009/0034337, whose disclosure is incorporated herein by reference, describes techniques for reading an adjacent cell of a memory array to determine a threshold voltage value of the adjacent cell, the adjacent cell being adjacent to a target cell, and reading the target cell of the memory array using a word-line voltage value based on the threshold voltage value of the adjacent cell. In some embodiments, in response to the command to read a target cell, the memory device may generate an internal read command, in addition to the original read command, to read an adjacent cell before reading the target cell.

U.S. Patent application Publication 2010/0034022, whose disclosure is incorporated herein by reference, describes techniques for compensating for capacitive coupling from storage elements on adjacent bit lines, by adjusting voltages applied to the adjacent bit lines. An initial rough read is performed to ascertain the data states of the bit line-adjacent storage elements, and during a subsequent fine read, bit line voltages are set based on the ascertained states and the current control gate read voltage which is applied to a selected word line. When the current control gate read voltage corresponds to a lower data state than the ascertained state of an adjacent storage element, a compensating bit line voltage is used. Compensation of coupling from a storage element on an adjacent word line can also be provided by applying different read pass voltages to the adjacent word line, and obtaining read data using a particular read pass voltage which is identified based on a data state of the word line-adjacent storage element.

U.S. Pat. No. 7,440,324, whose disclosure is incorporated herein by reference, describes techniques for accounting for electric field coupling in a non-volatile memory cell. To account for this coupling, the read process for a targeted memory cell provides compensation to an adjacent memory cell (or other memory cell) in order to reduce the coupling effect that the adjacent memory cell has on the targeted memory cell. The compensation applied is based on a condition of the adjacent memory cell. To apply the correct compensation, the read process at least partially intermixes read operations for the adjacent memory cell with read operations for the targeted memory cell.

Other example interference cancellation methods are described in PCT International Publication WO 2007/132453, whose disclosure is incorporated herein by reference.

SUMMARY OF THE INVENTION

An embodiment of the present invention that is described hereinbelow provides a method for data storage in a memory system that stores data by programming analog memory cells to respective programming states selected from a predefined set. The method includes providing a first read command that addresses one or more target memory cells and retrieves the data stored in the target memory cells, and a second read command that addresses one or more potentially-interfering memory cells and identifies at least one of the potentially-interfering memory cells that is programmed to a programming state in a predefined subset of the programming states that are expected to cause interference. Given data is stored in a first group of the memory cells. After storing the given data, the given data is retrieved by reading the first group using the first read command, reading a second group of the memory cells using the second read command, and compensating for the interference caused to the first group by the memory cells in the second group that were identified by the second read command.

In some embodiments, the second read command does not produce output that is unambiguously indicative of the data stored in the potentially-interfering memory cells. In an embodiment, storing the given data includes encoding the given data with an Error Correction Code (ECC), and retrieving the given data includes computing soft decoding metrics for the data read from the first group depending on the memory cells in the second group that were identified by the second read command, and decoding the ECC using the soft decoding metrics. Computing the soft decoding metrics may include assigning a low soft decoding metric to the data read from a given memory cell in the first group, if at least one memory cell in the second group, which neighbors the given memory cell, was identified by the second read command.

In a disclosed embodiment, the first read command compares respective analog storage values of the target memory cells to one or more first sets of read thresholds, and the second read command compares the respective analog storage values of the potentially-interfering memory cells to a second set of read thresholds, different from any of the first sets. In another embodiment, the second read command specifies one or more ranges of analog storage values that are expected to cause the interference, and identifies the potentially-interfering memory cells having the analog storage values falling in the ranges.

In some embodiments, the predefined subset of the programming states includes the programming states in which a change in analog storage value during programming from a previous programming state is larger than a predefined value. In an embodiment, retrieving the given data includes sending the first and second read commands from a memory controller to the memory cells, returning results of the first and second read commands to the memory controller, and compensating for the interference in the memory controller. In a disclosed embodiment, reading the first group includes reading a first word line, and reading the second group includes reading a second word line that neighbors the first word line.

There is additionally provided, in accordance with an embodiment of the present invention, a data storage apparatus including a memory and circuitry. The memory includes multiple analog memory cells. The circuitry is configured to store data in the memory by programming the analog memory cells to respective programming states selected from a predefined set, to provide a first read command that addresses one or more target memory cells and retrieves the data stored in the target memory cells, to provide a second read command that addresses one or more potentially-interfering memory cells and identifies at least one of the potentially-interfering memory cells that is programmed to a programming state in a predefined subset of the programming states that are expected to cause interference, to store given data in a first group of the memory cells, and, after storing the given data, to retrieve the given data by reading the first group using the first read command, reading a second group of the memory cells using the second read command, and compensating for the interference caused to the first group by the memory cells in the second group that were identified by the second read command.

There is also provided, in accordance with an embodiment of the present invention, a data storage apparatus including an interface and a processor. The interface is configured to communicate with a memory including multiple analog memory cells. The processor is configured to store data in the memory by programming the analog memory cells to respective programming states selected from a predefined set, to provide a first read command that addresses one or more target memory cells and retrieves the data stored in the target memory cells, to provide a second read command that addresses one or more potentially-interfering memory cells and identifies at least one of the potentially-interfering memory cells that is programmed to a programming state in a predefined subset of the programming states that are expected to cause interference, to store given data in a first group of the memory cells, and, after storing the given data, to retrieve the given data by reading the first group using the first read command, reading a second group of the memory cells using the second read command, and compensating for the interference caused to the first group by the memory cells in the second group that were identified by the second read command.

The present invention will be more fully understood from the following detailed description of the embodiments thereof, taken together with the drawings in which:

DETAILED DESCRIPTION OF EMBODIMENTS

Overview

Figure 1:
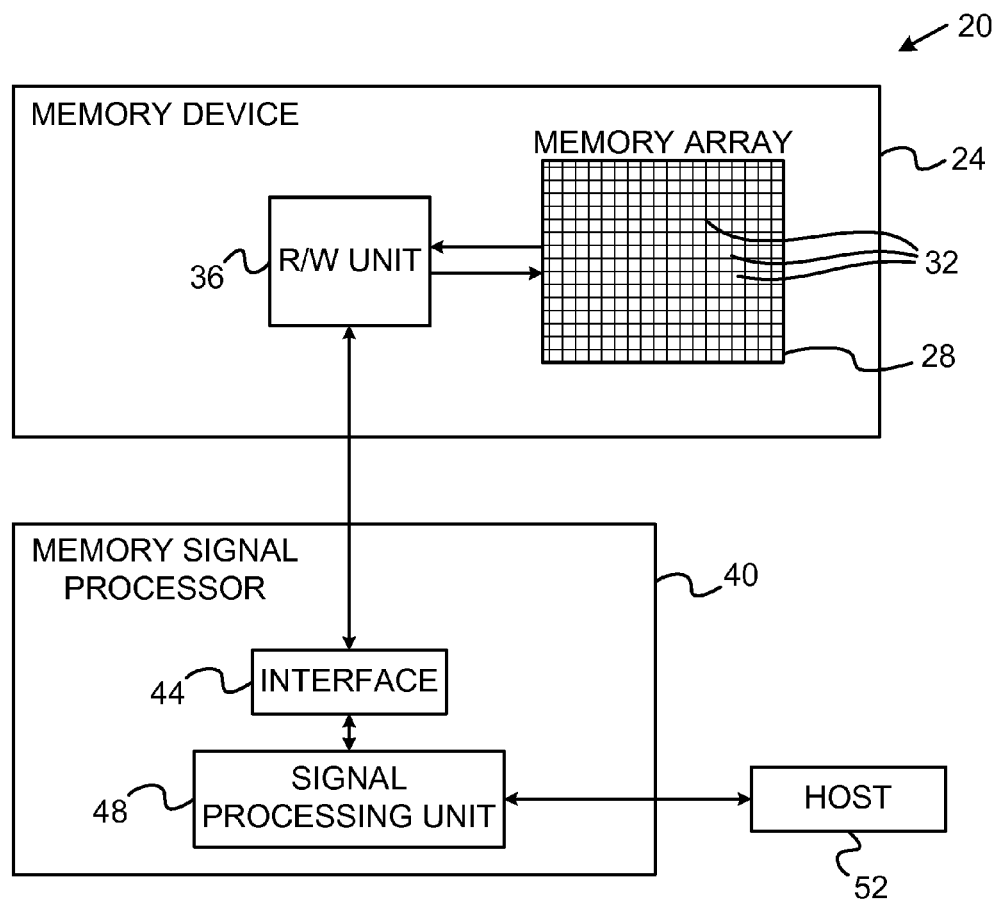
FIG. 1 is a block diagram that schematically illustrates a memory system, in accordance with an embodiment of the present invention.

In practical memory devices, memory cells may cause interference to one another, for example because of electric field cross-coupling between the memory cells. This interference may cause read errors and degrade the storage reliability of the memory.

Embodiments of the present invention that are described herein provide improved methods and systems for interference estimation and cancellation in arrays of analog memory cells. In the disclosed embodiments, data is stored in a group of memory cells by programming each memory cell to a respective analog storage value. Such programming may be accomplished by charging the cell until it reaches a certain threshold voltage that is indicative of the amount of electrical charge held in the memory cell. The analog storage value of each memory cell is selected from a predefined set of programming states. Each programming state corresponds to a respective data value, i.e., a respective combination of one or more data bits.

In some embodiments of the present invention, a memory system includes circuitry that stores data in the memory cells. The circuitry retrieves data from a group of target memory cells by reading the target memory cells, reading a group of interfering memory cells, and canceling the interference caused to the target memory cells by the interfering memory cells. The circuitry uses one type of read command ("normal read command") for reading the target memory cells, and a different type of read command ("interferer read command") for reading the interfering memory cells.

The normal read command aims to determine the data values stored in the target memory cells that are read by the command. The interferer read command, on the other hand, aims to identify which of the interfering memory cells read by the command is likely to cause strong interference. Using the two types of read commands improves the performance of the readout and interference cancellation process, as will be explained and demonstrated below.

In some embodiments, the above-described read commands are used in a Multi-Level Cell (MLC) memory in which each group (e.g., row) of memory cells is programmed in an iterative Programming and Verification (P&V) process. In such a process, a sequence of programming pulses is applied to the memory cells in the group, and the storage values of the memory cells are verified after each pulse.

Subsequent programming pulses are applied only to memory cells that have not yet reached their intended storage values. When a given group of memory cells is programmed using a P&V process, the storage values of the memory cells are distorted only by interference from memory cells that are programmed later than the given group. Interference from memory cells that were programmed earlier is automatically compensated for by the closed-loop P&V process.

The storage value of each multi-level memory cell represents a combination of two or more bits. In an eight-level memory, for example, each memory cell stores three bits that are referred to herein as Least Significant Bit (LSB), Central Significant Bit (CSB) and Most Significant Bit (MSB). In order to reduce interference, in some embodiments the memory is programmed in an interleaved manner: The high-order bits (e.g., MSBs) of a given group of memory cells are programmed only after the lower-order bits (e.g., LSBs and CSBs) of neighboring groups have been programmed. When using this interleaved programming order in combination with P&V, the level of interference that is not compensated by the P&V process is relatively small.

The level of interference caused by a given memory cell typically depends on the programming state of that memory cell. This dependence is not necessarily monotonic. In other words, the level of interference caused by a memory cell does not necessarily grow with the storage value of the cell. For example, when performing MSB programming in a group of memory cells that was previously programmed with LSB and CSB, some memory cells change their storage values considerably while others change only a little. Thus, some MSB programming states are characterized by a large change in storage values relative to the previously-programmed CSB programming states, while other MSB programming states are characterized by a small change in storage values.

On this basis, the programming states can be classified into a subset of programming states that are expected to cause interference, and other programming states that are not expected to cause interference. Using this classification, the interferer read command identifies which memory cells in the group read by the command belong to the subset of programming states that are expected to cause interference.

The circuitry recovers the data stored in the target group of memory cells from the results of the normal read command (applied to the target cells) and the interferer read command (applied to the potentially-interfering neighboring cells). In an example embodiment, the stored data is encoded with an Error Correction Code (ECC) that is decodable using soft decoding metrics. The circuitry computes the soft decoding metrics for the read data (results of the normal read command) based on the results of the interferer read command. For example, a target memory cell may be assigned a low metric if it has one or more neighboring cells belonging to the subset of programming states that are expected to cause interference, and vice versa.

Although it is possible in principle to read both the target memory cells and the interfering memory cells using the same type of read command, this solution is not optimal in terms of throughput, delay and computational complexity. The two readout operations have different objectives: Target cell readout aims to determine the data values stored in the read cells, whereas interferer cell readout aims to assess the level of interference caused by the read cells. By using different types of read commands for reading target memory cells and interfering memory cells, each type of read command can be optimized for its intended purpose.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. Although the embodiments described herein mainly address threshold voltages, the methods and systems described herein may be used with any other suitable kind of storage values.

System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a Memory Signal Processor (MSP) 40. MSP 40 comprises an interface 44 for communicating with memory device 24, and a signal processing unit 48 that processes the data that is written into and read from device 24. In some embodiments, unit 48 encodes the data for storage using a suitable Error Correction Code (ECC) and decodes the ECC of data retrieved from the memory. In some embodiments, unit 48 produces the storage values for storing in the memory cells and provides these values to R/W unit 36. Alternatively, unit 48 provides the data for storage, and the conversion to storage values is carried out by the R/W unit internally to the memory device. Alternatively to using an MSP, the methods described herein can be carried out by any suitable type of memory controller.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and the MSP may be integrated on separate semiconductor dies in a single Multi-Chip Package (MCP) or System on Chip (SoC), and may be interconnected by an internal bus. Further alternatively, some or all of the MSP circuitry may reside on the same die on which the memory array is disposed. Further alternatively, some or all of the functionality of MSP 40 can be implemented in software and carried out by a processor or other element of the host system. In some embodiments, host 44 and MSP 40 may be fabricated on the same die, or on separate dies in the same device package.

In some embodiments, MSP 40 (or other memory controller that carries out the methods described herein) comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Such blocks are referred to herein as erasure blocks or memory blocks. Typical memory devices may comprise several thousand erasure blocks. In a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

In some embodiments, R/W unit 36 programs memory cells 32 using an iterative Program and Verify (P&V) process. In a typical P&V process, an entire group of memory cells (e.g., a word line) is programmed by applying a sequence of programming pulses to the memory cells in the group. The storage values programmed in the cells are read after each pulse and compared ("verified") with one or more verification thresholds. The programming iterations continue selectively only for memory cells that have not yet reached the desired levels.

Figure 2:
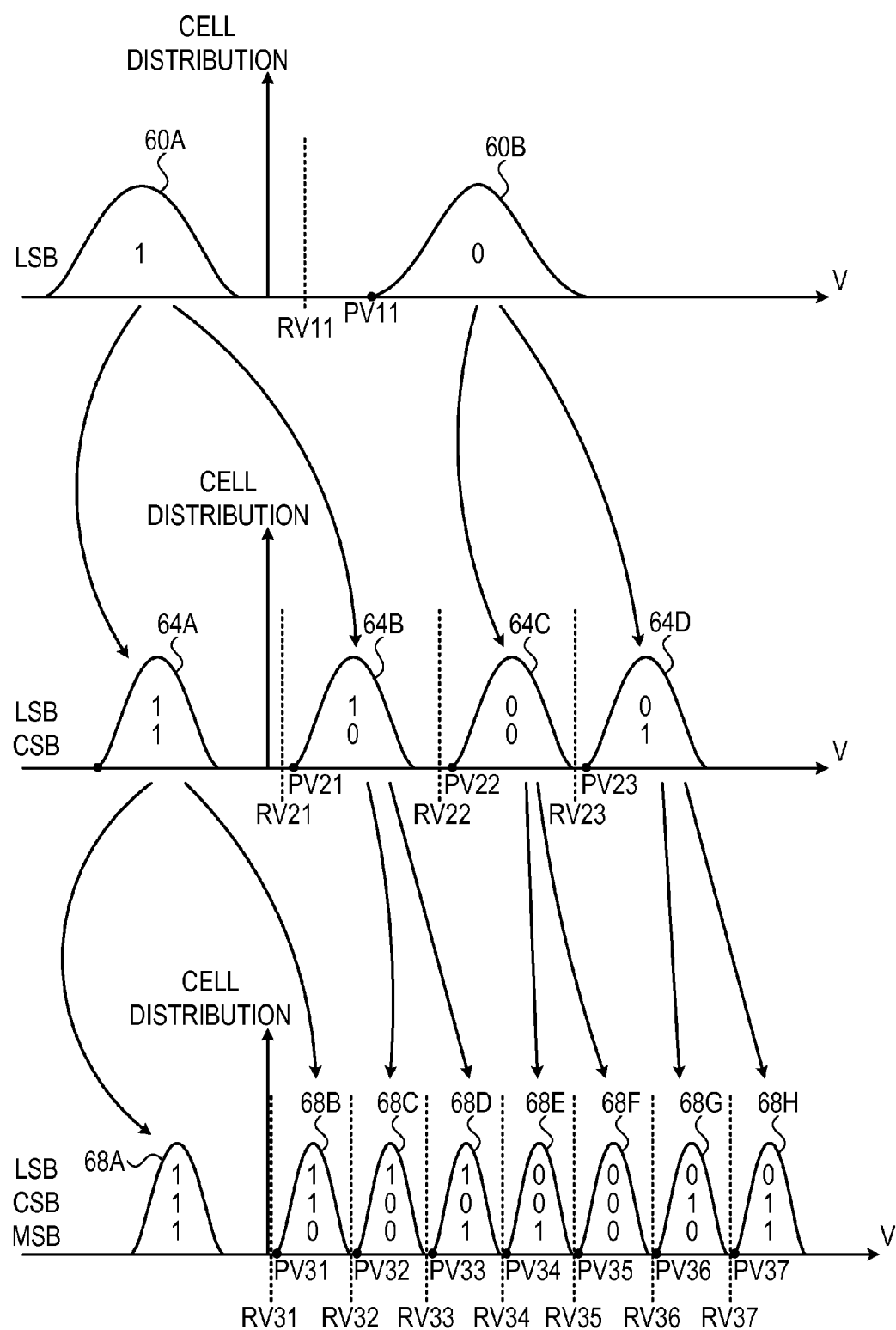
FIG. 2 is a diagram showing programming states in a group of multi-level analog memory cells, in accordance with an embodiment of the present invention.

FIG. 2 is a diagram showing programming states in a group of analog memory cells in memory device 24, in accordance with an embodiment of the present invention. The present example refers to eight-level memory cells, each storing three bits. Similar configurations, mutatis mutandis, can be used in other types of memory cells such as four-level or sixteen level cells. The description that follows refers to a group of memory cells that belong to a given word line. Generally, however, any other suitable group of memory cells can be used.

The graph at the top of the figure shows the threshold voltage distribution in the memory cells after the cells are programmed with LSB data. R/W unit 36 achieves this configuration by programming the memory cells in a P&V process, using a single verification threshold denoted PV11. Following LSB programming, the threshold voltages are distributed in two distributions 60A and 60B, which are also referred to as two programming states. The memory cells that store LSB="1" are in state 60A, and the memory cells that store LSB="0" are in state 60B. R/W unit 36 reads the LSB data at this stage using a read threshold denoted RV11.

The middle graph of FIG. 2 shows the threshold voltage distribution in the memory cells after the cells (which were previously programmed with LSB data) are programmed with CSB data. R/W unit 36 carries out CSB programming using three verification thresholds denoted PV21, PV22 and PV23. Following CSB programming, the threshold voltages of the memory cells are distributed in four programming states 64A ... 64D, which represent {LSB,CSB}={11},{10}, {00} and {01}, respectively. R/W unit 36 reads the LSB and CSB data at this stage using three read thresholds denoted RV21, RV22 and RV23.

The graph at the bottom of FIG. 2 shows the threshold voltage distribution in the memory cells after the cells (which were already programmed with LSB and CSB data) are programmed with MSB data. R/W unit 36 carries out MSB programming using seven verification thresholds denoted PV31 ... PV37. Following MSB programming, the threshold voltages of the memory cells are distributed in eight programming states 68A . . . 68H, which represent {LSB,CSB, MSB}={111},{110},{100},{101},{001},{000},{010} and {011}, respectively. R/W unit 36 reads the LSB, CSB and MSB data at this stage using seven read thresholds denoted RV31 ... RV37.

The mapping of bit values to programming states in this example is set according to a "Gray coding" scheme, in which any two adjacent programming states differ by only a single bit value. In alternative embodiments, any other suitable mapping scheme can be used.

Memory Cell Programming States and their
Contribution to Interference

In some embodiments, R/W unit 36 programs the memory cells with LSB, CSB and MSB data in the different word lines of array 28 in an interleaved manner in order to reduce interference. For example, the R/W unit may program the CSB data in a given word line only after the LSB data has been programmed in the neighboring word lines. Similarly, the R/W unit may program the MSB data in a given word line only after the LSB and CSB data has been programmed in the neighboring word lines. Interleaved programming orders of this sort help to reduce cross-coupling interference, because they reduce the changes in storage values that are not compensated for by the P&V process.

Programming orders for reducing interference are addressed, for example, by Takeuchi et al., in "A Multipage Cell Architecture for High-Speed Programming Multilevel NAND Flash Memories," IEEE Journal of Solid-State Circuits, volume 33, issue 8, August, 1998, pages 1228-1238, which is incorporated herein by reference, and in PCT International Publication WO 2009/037691, whose disclosure is incorporated herein by reference.

In a given memory device, the amount of change in storage value differs from one programming state to another. Some programming states are characterized by relatively large storage value changes, while others are characterized by relatively small storage value changes.

Consider, for example, the CSB programming stage in FIG. 2 (the transition from the top graph to the middle graph). In this stage, LSB programming state 60A is split into two CSB programming states 64A and 64B depending on the programmed CSB data values. LSB programming state 60B is similarly split into two CSB programming states 64C and 64D. As can be seen in the figure, the transition from LSB state 60A to CSB state 64A involves a relatively small change in storage value (threshold voltage in the present example), while the transition from LSB state 60A to CSB state 64B involves a relatively large storage value change. Similarly, the transition from LSB state 60B to CSB state 64C involves a small change in storage value, while the transition from LSB state 60B to CSB state 64D involves a large storage value change.

As can be seen in this example, the CSB data values being programmed do not uniquely indicate the amount of storage value change: Programming the same CSB data value involves a small change in storage value in some cases, and a large change in storage value in other cases.

In the example of FIG. 2, the transitions to CSB states 64B and 64D are characterized by a relatively large storage value change. As a result, neighboring memory cells that are programmed to these programming states are likely to cause considerable interference that is not compensated for by the P&V process. Neighboring memory cells that are programmed to the remaining CSB programming states (64A, 64C) are unlikely to cause considerable interference, because they involve a relatively small change in storage value relative to the previous LSB states from which they originate.

Consider now the MSB programming stage (the transition from the middle graph to the bottom graph of FIG. 2). In this stage, each CSB programming state is split into two MSB programming states depending on the programmed MSB data values. As can be seen in the figure, the transitions to MSB states 68B, 68D, 68F and 68H involve a relatively large change in storage values. The transitions to MSB states 68A, 68C, 68E and 68G, on the other hand, involve a relatively small change in storage values. Therefore, neighboring memory cells that are programmed to MSB states 68B, 68D, 68F and 68H are likely to cause considerable interference that is not compensated for by the P&V process. Neighboring memory cells that are programmed to the remaining MSB programming states (68A, 68C, 68E and 68G) are unlikely to cause considerable interference.

In summary, a predefined subset of the programming states in system 20 is characterized by large storage value change relative to the programming states from which they originate. For example, the subset may be defined as including the programming states in which the change in analog storage value during programming from a previous programming state exceeds a certain predefined value. Neighboring memory cells that are programmed to these programming states are expected to cause significant interference. Neighboring memory cells that are programmed to the remaining programming states are expected to cause little or no interference, because their programming involves a small change in storage value.

In the present example, this predefined subset of programming states includes CSB states 64B and 64D and MSB states 68B, 68D, 68F and 68H. In another example embodiment, the erased level is positioned at a very negative threshold voltage, such that the transition from state 60A to state 64B (Programming of CSB="0" in memory cells that store LSB="1") is considerably stronger than any other transition. In this embodiment, state 64B may be regarded as a predefined subset of programming states that potentially cause particularly strong interference. Further alternatively, any other suitable set of programming states, and any other suitable predefined subset of potentially-interfering programming states, can be used.

Normal and Interferer Read Commands

System 20 typically retrieves data from a group of target memory cells (e.g., a target word line) by reading the group of target cells, reading a group of interfering cells (e.g., a neighboring word line), and canceling the interference caused by the interfering cells to the read results of the target cells. In some embodiments, system 20 reads the interfering memory cells using a dedicated read command that is different from the normal read command used for reading the target memory cells. The dedicated command is referred to as an interferer read command.

Unlike the normal read command, the interferer read command does not aim to determine the data values stored in the read memory cells. Rather, the interferer read command identifies which of the read memory cells are likely to cause severe interference. In some embodiments, the interferer read commands identifies which of the read memory cells is in a programming state belonging to the above-described predefined subset of programming states that are expected to cause interference.

Figure 3:
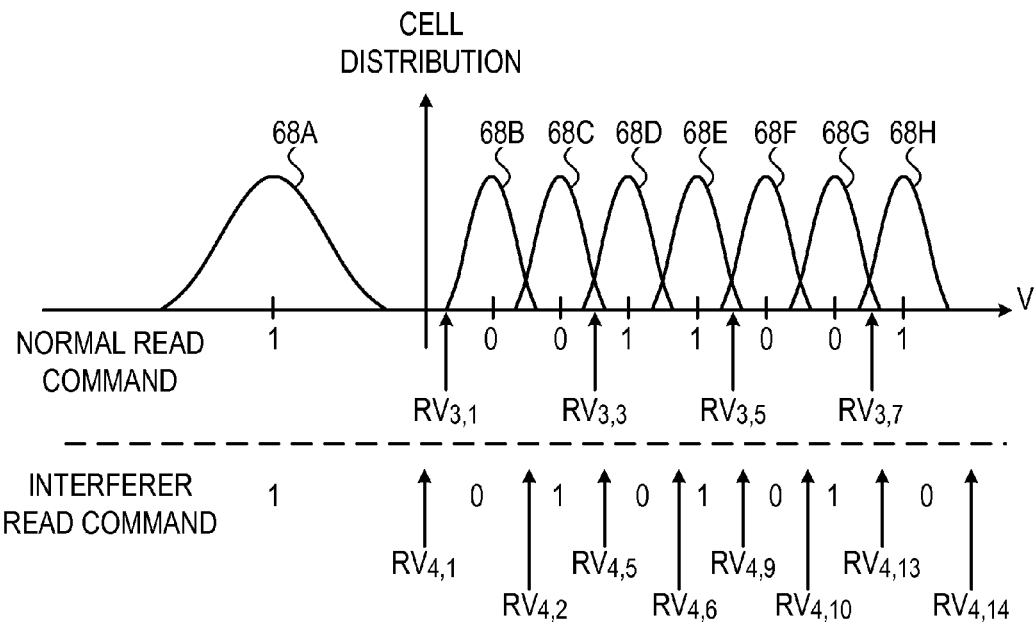
FIGS. 3 and 4 are diagrams showing a normal read command and an interferer read command, in accordance with embodiments of the present invention.

FIG. 3 is a diagram showing a normal read command and an interferer read command, in accordance with an embodiment of the present invention. The present example refers to an MSB readout command. Normal and interferer read commands that perform CSB readout are described in FIG. 4 below. In the example of FIG. 3, both the target cells and the interfering cells are programmed with LSB, CSB and MSB data.

R/W unit 36 reads the MSB data from the target memory cells using the normal read command. As shown in the figure, the normal read command compares the threshold voltages of the memory cells to four read thresholds denoted $RV_{3,1}$, $RV_{3,3}$, $RV_{3,5}$ and $RV_{3,7}$. For memory cells whose threshold voltage is either below $RV_{3,1}$, between $RV_{3,3}$ and $RV_{3,5}$, or above $RV_{3,7}$, the normal read command returns "1". For memory cells whose threshold voltage is between $RV_{3,1}$ and $RV_{3,3}$, or between $RV_{3,5}$ and $RV_{3,7}$, the normal read command returns "0".

The R/W unit reads the interfering memory cells using the interferer read command. As seen in the figure, the interferer read command compares the threshold voltages of the memory cells to eight read thresholds denoted $RV_{4,1}$, $RV_{4,2}$, $RV_{4,5}$, $RV_{4,6}$, $RV_{4,9}$, $RV_{4,10}$, $RV_{4,13}$ and $RV_{4,14}$. For memory cells whose threshold voltages belong to programming states 68B, 68D, 68F or 68H, the interferer read command returns "0". For other memory cells, the interferer read command returns "1".

As explained above, programming states 68B, 68D, 68F and 68H are the MSB programming states that are characterized by large threshold voltage changes. Thus, the interferer read command returns "0" for memory cells that are expected to cause high interference, and "1" for the other memory cells. As seen in the figure, the results of the interferer read command are not indicative of the data values stored in the interfering cells, but rather of the interference they are expected to cause.

Figure 4:
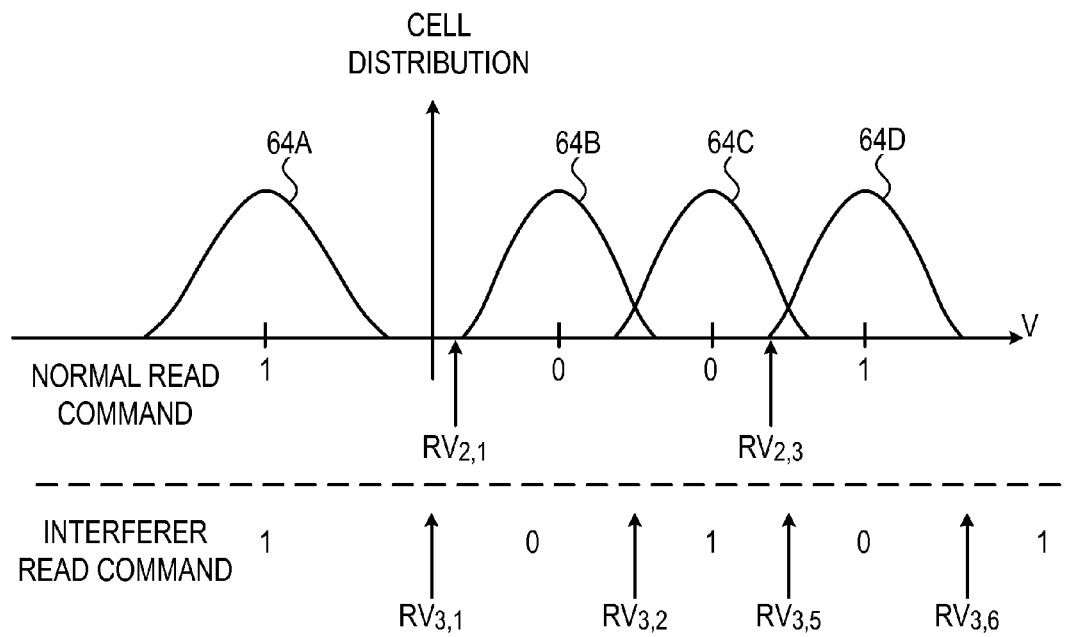

FIG. 4 is a diagram showing a normal read command and an interferer read command, in accordance with another embodiment of the present invention. The example of FIG. 4 refers to a CSB readout command. In this example, both the target cells and the interfering cells are programmed with LSB and CSB data, but not MSB data.

The normal read command reads the CSB data from the memory cells by comparing the cell threshold voltages to two read thresholds denoted $RV_{2,1}$ and $RV_{2,3}$. For memory cells whose threshold voltage is between $RV_{2,1}$ and $RV_{2,3}$, the normal read command returns "0". For memory cells whose threshold voltage is below $RV_{2,1}$ or above $RV_{2,3}$, the normal read command returns "1". The interferer read command compares the threshold voltages of the memory cells to four read thresholds denoted $RV_{3,1}$, $RV_{3,2}$, $RV_{3,5}$ and $RV_{3,6}$. For memory cells whose threshold voltages belong to programming states 64B or 64D, the interferer read command returns "0". Otherwise, the interferer read command returns "1".

As explained above, programming states 64B and 64D are the CSB programming states that are characterized by large threshold voltage changes. Thus, the interferer read command returns "0" for memory cells that are expected to cause high interference, and "1" for the other memory cells. As in the MSB readout example of FIG. 3, the results of the interferer read command are not indicative of the data values stored in the interfering cells, but rather of the interference they are expected to cause.

As can be seen in the examples of FIGS. 3 and 4 above, the interferer read command typically uses a different set of read thresholds than the normal read command. Although these examples refer to normal read commands that apply a single set of read thresholds, in some embodiments the normal read command reads the target memory cells multiple times using multiple different sets of read thresholds. In such embodiments, the interferer read command typically uses a set of read thresholds that differs from any of the read threshold sets used by the normal read command.

In some embodiments, the highest read threshold of the interferer read command ($RV_{4,14}$ in the MSB command and $RV_{3,6}$ in the CSB command) is omitted. This technique is useful, for example, in memory devices that are limited in setting read thresholds at the high end of the threshold voltage window. In practice, omitting the highest read threshold (e.g., by setting it to infinity) often improves readout performance, because the threshold voltage distribution of the highest programming state may have a long upper tail.

One reason to include the highest read threshold is that the interferer read command can then be implemented using one or more conventional read commands that are supported by the memory device. For example, including read threshold $RV_{4,14}$ in the interferer read command enables the command to be implemented using a 3 bits/cell MSB read implemented on a 2 bits/cell device. A command of this sort, which is useful for soft decoding, typically needs $RV_{4,14}$. Certain aspects of implementing read commands are described, for example, in U.S. Patent Application Publications 2009/0106485 and 2010/0124088, whose disclosures are incorporated herein by reference.

If the memory device enables varying the read thresholds over a wide range, $RV_{4,14}$ can be set to a suitable large value, making it effectively infinite. If, on the other hand, the highest read threshold is bounded for some reason, the interferer read command itself may be defined so as to genuinely compare the cell threshold voltages to $RV_{4,13}$ and return an "always TRUE" result for the comparison with $RV_{4,14}$.

Interference Cancellation Using Results of Normal and Interferer Read Commands MSP 40 may perform interference cancellation in various ways based on the results of the normal read command and the interferer read command. In some embodiments, the stored data is encoded with an ECC, and the MSP decodes the ECC using a soft decoding process that operates on soft decoding metrics assigned to the read data bits. For example, the ECC may comprise a Low Density Parity Check (LDPC) code that is decoded based on Log Likelihood Ratios (LLRs) assigned to the read data bits.

In these embodiments, the MSP may use the results of the interferer read commands to identify target cells that are likely to suffer from strong interference. For example, the MSP may identify target memory cells having neighbors (within the group of interfering memory cells) that belong to the subset of programming states that are expected to cause high interference. Once identified, the MSP may assign the data read from these target cells lower soft decoding metrics relative to the data read from the other memory cells.

By assigning low soft decoding metrics to memory cells that are likely to suffer from strong interference, the error correction capability of the ECC is improved. As a result, the probability of reading the data from the target memory cells erroneously is reduced. Alternatively, MSP 40 may cancel the interference caused by the interfering memory cells to the target memory cells based on the results of the normal read command and the interferer read command in any other suitable manner.

In some embodiments, the interferer read commands can be implemented using built-in multi-threshold commands that are supported by the memory device. Such commands typically enable flexible setting of the read thresholds to the appropriate values. Example readout techniques that use multi-threshold commands are described in U.S. Patent Application Publication 2009/0106485, cited above.

In some embodiments, MSP 40 and memory device 24 communicate with one another using a command interface that supports the normal and interferer read commands. In an example embodiment, the MSP sends to the memory device normal read commands for reading target cells and interferer read commands for reading interfering cells, as appropriate. R/W unit 36 in the memory device is configured to execute the normal and interferer read commands in array 28 by setting the appropriate read thresholds and returning the appropriate readout results (e.g., the read thresholds and readout results illustrated in FIGS. 3 and 4 above).

In alternative embodiments, MSP 40 and R/W unit 36 may carry out interference cancellation while partitioning the readout functions between them in any other suitable manner.

Any other suitable interface between the MSP and memory device can be used for this purpose. In the present context, the MSP and R/W unit are referred to herein collectively as "circuitry" that carries out the disclosed techniques.

In the embodiments described above, the group of target cells comprises the cells in a certain word line, and the interfering memory cells comprise the cells in a neighboring word line. In alternative embodiments, any other suitable groups of memory cells may be regarded as target cells and interfering cells. For example, the target cells and interfering cells may belong to the same word line (e.g., odd- and even-order cells in the same word line). As another example, the interfering memory cells may belong to two or more word lines, e.g., the two neighbor word lines on either side of the target word line.

The normal and interferer read commands shown in FIGS. 3 and 4 are example commands that are chosen purely for the sake of conceptual clarity. In alternative embodiments, any other suitable normal and interferer read commands can be used.

Interference Cancellation Method Description

Figure 5:
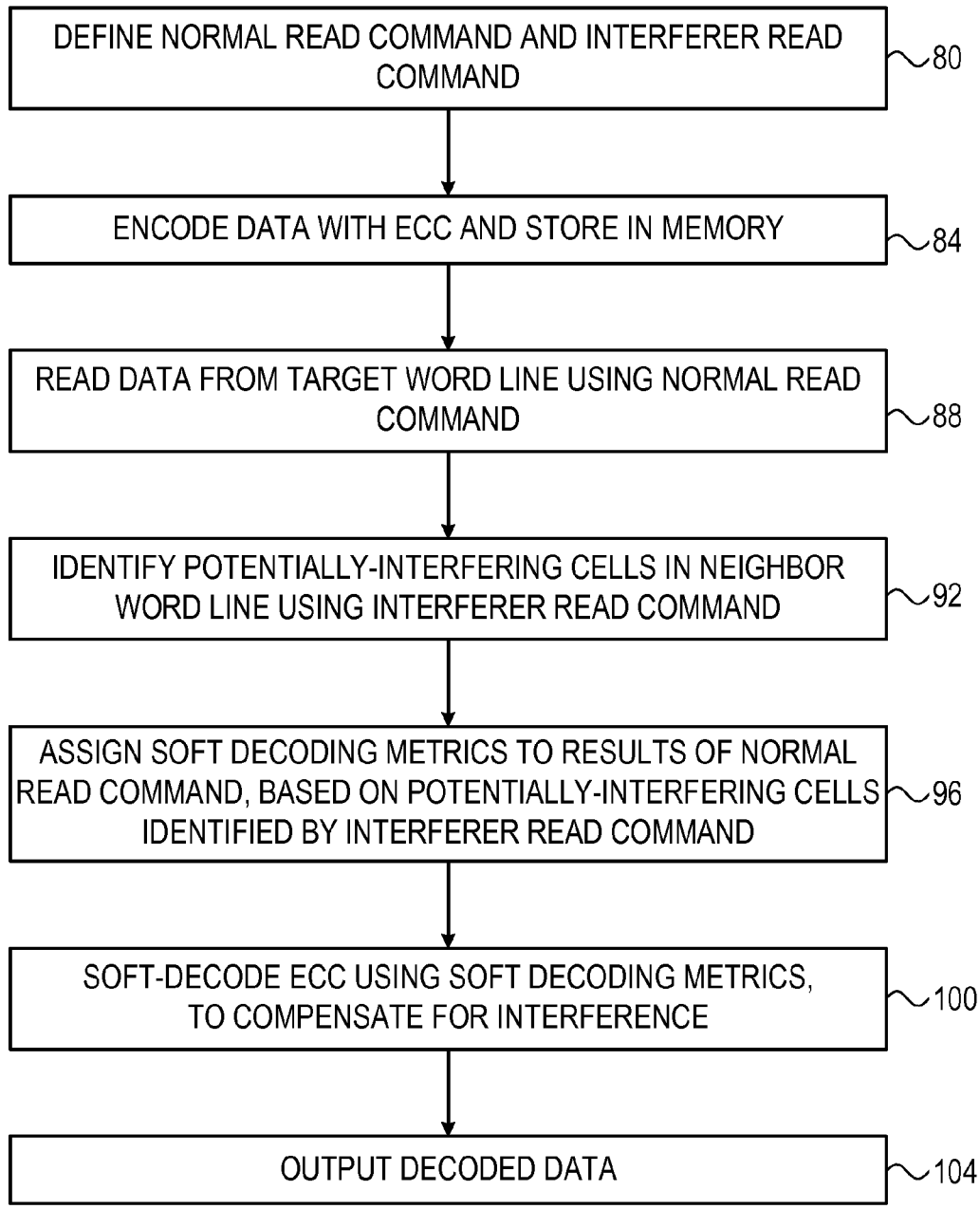
FIG. 5 is a flow chart that schematically illustrates a method for interference cancellation, in accordance with an embodiment of the present invention.

FIG. 5 is a flow chart that schematically illustrates a method for interference cancellation, in accordance with an embodiment of the present invention. The method begins with system 20 (e.g., MSP 40 and/or R/W unit 36) defining the normal and interferer read commands, at a definition step 80. MSP 40 encodes data for storage with an ECC and stores the encoded data in memory device 24, at a storage step 84.

At a later point in time, the MSP retrieves the stored data, e.g., in response to a request from host 52. In order to retrieve the data from a certain target word line, the MSP instructs R/W unit 36 to read the target word line using the normal read command, at a target readout step 88. The MSP instructs the R/W unit to read an interfering word line using the interferer read command, at an interferer readout step 92. (The order of steps 88 and 92 may be reversed if desired.) As explained above, the interferer read command identifies the memory cells in the interfering word line that belong the predefined subset of programming states that are expected to cause strong interference.

The MSP assigns soft decoding metrics to the data bits read from the target word line, based on the results of the interferer read command, at a metric assignment step 96. The MSP then decodes the ECC in a soft decoding process using the assigned soft decoding metrics, at a decoding step 100. The MSP provides the decoded data as output, at an output step 104.

In a typical embodiment, the normal read command (e.g., the command executed at step 88) obtains soft information as to the threshold voltages of the memory cells. For example, the normal read command may re-read the target memory cells multiple times using multiple different sets of read thresholds. This sort of read command provides high-resolution information as to the threshold voltages of the memory cells, and therefore improves the quality of interference cancellation. Any other type of soft readout, e.g., readout using an Analog-to-Digital Converter (ADC) having a resolution of more than one bit, may also be used. Nevertheless, the disclosed techniques can also be implemented using normal read commands that perform hard readout.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method comprising:
   storing data in a group of target memory cells of a memory system by programming analog memory cells to respective programming states selected from a predefined set;
   issuing a first read command that addresses one or more target memory cells and retrieves the data stored in the target memory cells;
   issuing a second read command that addresses one or more memory cells neighboring the target memory cells, wherein the second read command identifies at least one of the neighboring memory cells as being programmed to a programming state in a predefined subset of the programming states that are expected to cause interference to the target memory cells; and
   compensating for the interference caused to the target memory cells based upon the programming state of the neighboring memory cells that were identified by the second read command;
   wherein storing the data comprises encoding the data with an Error Correction Code (ECC), and wherein reading the data using the first read command comprises computing soft decoding metrics for the data read from the target memory cells based on the neighboring memory cells that were identified by the second read command, and decoding the ECC of the target memory cells using the soft decoding metrics.

2. The method according to claim 1, wherein the second read command does not produce output that is unambiguously indicative of the data stored in the neighboring memory cells.

3. The method according to claim 1, wherein computing the soft decoding metrics comprises assigning a low soft decoding metric to the data read from a given target memory cell, if at least one neighboring memory cell was identified by the second read command.

4. The method according to claim 1, wherein the first read command compares respective analog storage values of the target memory cells to one or more first sets of read thresholds, and wherein the second read command compares the respective analog storage values of the neighboring memory cells to a second set of read thresholds, different from any of the first sets.

5. The method according to claim 1, wherein the second read command specifies one or more ranges of analog storage values that are expected to cause the interference, and identifies the neighboring memory cells having the analog storage values falling in the ranges.

6. The method according to claim 1, wherein the predefined subset of the programming states includes the programming states in which a change in analog storage value during programming from a previous programming state is larger than a predefined value.

7. The method according to claim 1, wherein reading the data comprises sending the first and second read commands from a memory controller to the memory cells, returning results of the first and second read commands to the memory controller, and compensating for the interference in the memory controller.

8. The method according to claim 1, wherein reading the target memory cells comprises reading a first word line, and wherein reading the neighboring memory cells comprises reading a second word line that neighbors the first word line.

9. A data storage apparatus, comprising:
a memory comprising multiple analog memory cells; and
circuitry coupled to the memory and configured to:
- store data in the memory by programming the analog memory cells to respective programming states selected from a predefined set;
- provide a first read command that addresses one or more target memory cells and retrieves the data stored in the target memory cells;
- provide a second read command that addresses one or more potentially-interfering memory cells and identifies at least one of the potentially-interfering memory cells that is programmed to a programming state in a predefined subset of the programming states that are expected to cause interference;
- store given data in a first group of the memory cells; and
- after storing the given data, retrieve the given data by:
  - reading the first group using the first read command;
  - reading a second group of the memory cells using the second read command; and
  - compensating for the interference caused to the first group by the memory cells in the second group that were identified by the second read command;
- wherein the circuitry is configured to encode the given data with an Error Correction Code (ECC), and to retrieve the given data by computing soft decoding metrics for the data read from the first group depending on the memory cells in the second group that were identified by the second read command, and decoding the ECC using the soft decoding metrics.

10. The apparatus according to claim 9, wherein the second read command does not produce output that is unambiguously indicative of the data stored in the potentially-interfering memory cells.

11. The apparatus according to claim 9, wherein the circuitry is configured to assign a low soft decoding metric to the data read from a given memory cell in the first group, if at least one memory cell in the second group, which neighbors the given memory cell, was identified by the second command.

12. A data storage apparatus comprising:
a memory comprising multiple analog memory cells; and
circuitry coupled to the memory and configured to:
- store data in the memory by programming the analog memory cells to respective programming states selected from a predefined set;
- provide a first read command that addresses one or more target memory cells and retrieves the data stored in the target memory cells;
- provide a second read command that addresses one or more potentially-interfering memory cells and identifies at least one of the potentially-interfering memory cells that is programmed to a programming state in a predefined subset of the programming states that are expected to cause interference;
- store given data in a first group of the memory cells; and
- subsequent to storing the given data the circuitry is configured to:
  - read the first group using the first read command and;
  - read a second group of the memory cells using the second read command; and
- compensate for the interference caused to the first group by the memory cells in the second group that were identified by the second read command;
- wherein the first read command compares respective analog storage values of the target memory cells to one or more first sets of read thresholds, and wherein the second read command compares the respective analog storage values of the potentially-interfering memory cells to a second set of read thresholds, different from any of the first sets.

13. The apparatus according to claim 9, wherein the second read command specifies one or more ranges of analog storage values that are expected to cause the interference, and identifies the potentially-interfering memory cells having the analog storage values falling in the ranges.

14. The apparatus according to claim 9, wherein the predefined subset of the programming states includes the programming states in which a change in analog storage value during programming from a previous programming state is larger than a predefined value.

15. The apparatus according to claim 9, wherein the circuitry comprises a Read/Write (R/W) unit that is coupled to the memory and a controller that communicates with the R/W unit over an interface, wherein the controller is configured to send the first and second read commands over the interface to the R/W unit and to compensate for the interference based on results of the first and second read commands, and wherein the R/W unit is configured to execute the first and second read commands in the memory cells and to return the results over the interface to the controller.

16. The apparatus according to claim 9, wherein the circuitry is configured to read the first group by reading a first word line, and to read the second group by reading a second word line that neighbors the first word line.

* * * * *